(12) United States Patent
Leem et al.

(10) Patent No.: US 7,995,625 B2
(45) Date of Patent: Aug. 9, 2011

(54) RESONATOR OF HYBRID LASER DIODE

(75) Inventors: Young Ahn Leem, Daejeon (KR); Jung-Ho Song, Daejeon (KR); Kisoo Kim, Daejeon (KR); Gyungock Kim, Seoul (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 210 days.

(21) Appl. No.: 12/499,069

(22) Filed: Jul. 7, 2009

(65) Prior Publication Data

US 2010/0142579 A1    Jun. 10, 2010

(30) Foreign Application Priority Data

Dec. 8, 2008 (KR) .................. 10-2008-0124019
Apr. 10, 2009 (KR) .................. 10-2009-0031273

(51) Int. Cl.
*H01S 3/098* (2006.01)
*H01S 3/03* (2006.01)
*H01S 3/082* (2006.01)

(52) U.S. Cl. .................. 372/19; 372/64; 372/97
(58) Field of Classification Search .................. 372/19, 372/64, 97
See application file for complete search history.

(56) References Cited

U.S. PATENT DOCUMENTS 6,580,850 B1   6/2003   Kazarinov et al.

FOREIGN PATENT DOCUMENTS

KR   10-0347636 B1   8/2002

*Primary Examiner* — Armando Rodriguez

(57) ABSTRACT

Provided is a resonator of a hybrid laser diode. The resonator includes: a substrate including a semiconductor layer where a hybrid waveguide, a multi-mode waveguide, and a single mode waveguide are connected in series; a compound semiconductor waveguide, provided on the hybrid waveguide of the semiconductor layer, having a tapered coupling structure at one end of the compound semiconductor waveguide, the tapered coupling structure overlapping the multi-mode waveguide partially; and a reflection part provided on one end of the single mode waveguide. The multi-mode waveguide has a narrower width than the hybrid waveguide and the single mode waveguide has a narrower width than the multi-mode waveguide.

10 Claims, 5 Drawing Sheets

RESONATOR OF HYBRID LASER DIODE

CROSS-REFERENCE TO RELATED APPLICATIONS

This U.S. non-provisional patent application claims priority under 35 U.S.C. §119 of Korean Patent Application No. 10-2008-0124019, filed on Dec. 8, 2008 and Korean Patent Application No. 10-2009-0031273, filed on Apr. 10, 2009, the entire contents of which are hereby incorporated by reference.

BACKGROUND OF THE INVENTION

The present invention disclosed herein relates to a hybrid laser diode, and more particularly, to a resonator of a hybrid laser diode.

A hybrid laser diode using a hybrid combination of a silicon and a Group III-V compound semiconductor gains in importance as a light source for silicon photonics technology that merges an optical device and an electronic device.

When this hybrid laser diode is used as a light source for information transmission, a laser diode operating in a single mode is required to improve transmission quality.

With the advent of a Silicon On Insulator (SOI) substrate, a structure of a silicon optical waveguide becomes possible. Accordingly, an optical device can be integrated into an electronic device of a silicon substrate. This new research field is called silicon photonics. However, the silicon itself cannot have a gain in a wavelength band for optical communication, and thus an external light source must be used. In order to resolve this limitation, researches for a hybrid laser diode using wafer bonding technology between a compound semiconductor and a silicon have been recently conducted.

Since a hybrid laser diode is manufactured using the wafer bonding technology, a technique for forming a structure of diverse forms through a re-growth method, which is used for a compound semiconductor laser diode, cannot be used for the hybrid laser diode.

An important factor determining the performance of the hybrid laser diode is a structure of a compound semiconductor waveguide. A structure that may be be used for this compound semiconductor waveguide includes a ridge waveguide and a slap waveguide. When the compound semiconductor structure is the ridge waveguide, a single mode waveguide is formed even if a sectional area of a silicon waveguide is small and has an advantage that a high carrier confinement characteristic is obtained. However, there is a disadvantage that a leakage current occurs due to a surface recombination effect at the surface of the compound semiconductor waveguide exposed to the external. Unlike this, when the compound semiconductor waveguide structure is the slap waveguide, the slap waveguide basically supports a multi-mode and also an impurity region confining a carrier needs to be formed using an ion implantation technique to improve the carrier confinement characteristic. However, it is difficult to form the width of the impurity region to be small and accurate. As a result, it is difficult to oscillate a stable fundamental mode.

SUMMARY OF THE INVENTION

The present invention provides a hybrid laser diode capable of minimizing a surface recombination effect occurring at a compound semiconductor waveguide of a resonator and performing a stable fundamental mode oscillation.

The objects that present invention tried to resolve are not limited to the above and unmentioned other objects will be clearly understandable to those skilled in the art with reference to the below description.

Embodiments of the present invention provide resonators of a hybrid laser diode including: a substrate including a semiconductor layer where a hybrid waveguide, a multi-mode waveguide, and a single mode waveguide are connected in series; a compound semiconductor waveguide, provided on the hybrid waveguide of the semiconductor layer, having a tapered coupling structure at one end of the compound semiconductor waveguide, the tapered coupling structure overlapping the multi-mode waveguide partially; and a reflection part provided on one end of the single mode waveguide, wherein the multi-mode waveguide has a narrower width than the hybrid waveguide and the single mode waveguide has a narrower width than the multi-mode waveguide.

In some embodiments, the compound semiconductor waveguide has a width of more than about 5 µm.

In other embodiments, the compound semiconductor waveguide includes a Group III-V compound semiconductor.

In still other embodiments, the substrate is a silicon on insulator (SOI) substrate including an underlying semiconductor layer, an insulation layer on the underlying semiconductor layer, and the semiconductor layer on the insulation layer.

In even other embodiments, the compound semiconductor waveguide is formed by bonding with the semiconductor layer of the substrate.

In yet other embodiments, the resonators further include a mode selecting unit provided between the multi-mode waveguide and the single mode waveguide.

In further embodiments, the mode selecting unit is a multi-mode interference waveguide.

In still further embodiments, the reflection part uses a distributed Bragg reflector or a facet reflection, the disturbed Bragg reflector being a waveguide with diffraction gratings.

In even further embodiments, the hybrid waveguide, the multi-mode waveguide, and the single mode waveguide are connected in series through respective transition area waveguides therebetween.

In yet further embodiment, the transition area waveguide has a width that becomes narrower when it approaches from the hybrid waveguide to the multi-mode waveguide and from the multi-mode waveguide to the single mode waveguide.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION OF PREFERRED EMBODIMENTS

Figure 1:
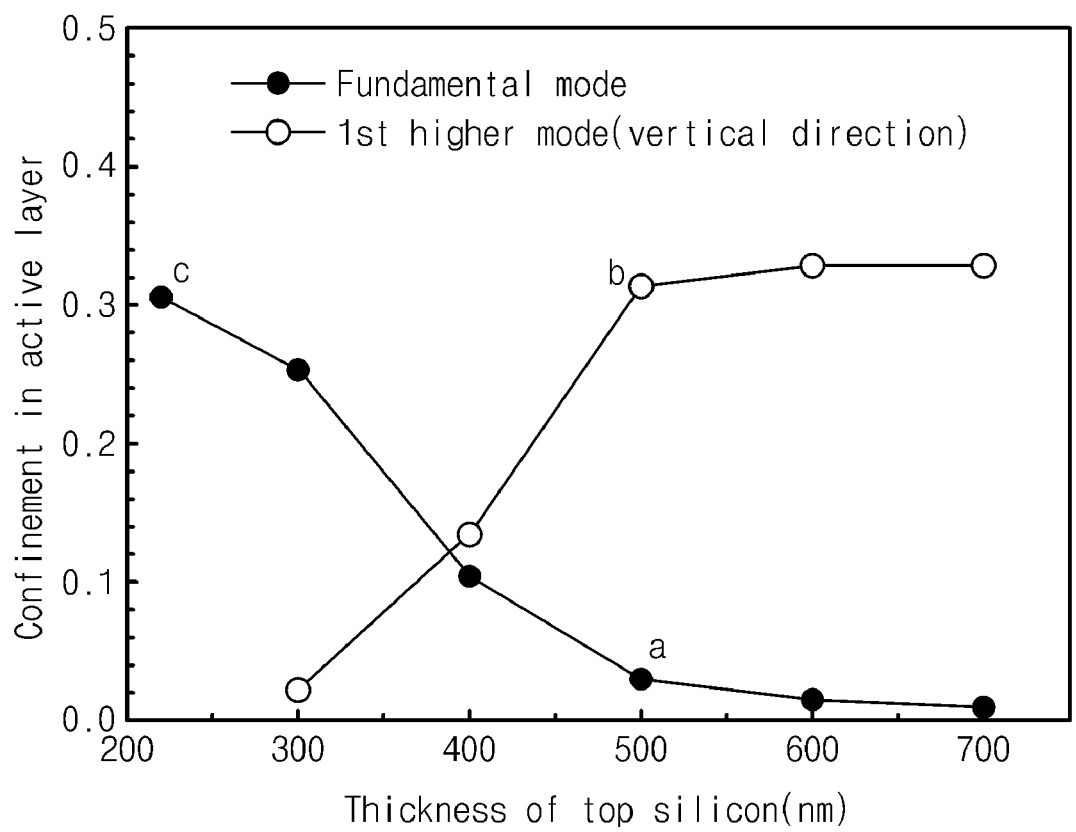
FIG. 1 is a graph illustrating an optical confinement of an active layer according to a thickness of a silicon layer in a conventional hybrid laser diode.

Preferred embodiments of the present invention will be described below in more detail with reference to the accompanying drawings. Preferred embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims. Therefore, in some embodiments, well-known processes, device structures, and technologies will not be described in detail to avoid ambiguousness of the present invention. An embodiment described and exemplified herein includes a complementary embodiment thereof. Like reference numerals refer to like elements throughout.

In the following description, the technical terms are used only for explain a specific exemplary embodiment while not limiting the present invention. The terms of a singular form may include plural forms unless referred to the contrary. The meaning of "include," "comprise," "including," or "comprising," specifies a property, a region, a fixed number, a step, a process, an element and/or a component but does not exclude other properties, regions, fixed numbers, steps, processes, elements and/or components. It will be understood that when an element such as a layer, film, region, or substrate is referred to as being "on" another element, it can be directly on the other element or intervening elements may also be present.

Additionally, the embodiment in the detailed description will be described with sectional views as ideal exemplary views of the present invention. In the figures, the dimensions of layers and regions are exaggerated for clarity of illustration. Accordingly, shapes of the exemplary views may be modified according to manufacturing techniques and/or allowable errors. Therefore, the embodiments of the present invention are not limited to the specific shape illustrated in the exemplary views, but may include other shapes that may be created according to manufacturing processes. For example, an etching area at a right angle may have a rounded form or a predetermined curvature. Areas exemplified in the drawings have general properties, and are used to illustrate a specific shape of a semiconductor package region. Thus, this should not be construed as limited to the scope of the present invention.

FIG. 1 is a graph illustrating an optical confinement of an active layer according to a thickness of a silicon layer in a conventional hybrid laser diode.

Referring to FIG. 1, a fundamental mode and an optical confinement coefficient change of up and down direction (vertical distribution) in an active layer of a first higher mode according to the thickness of a silicon slap waveguide is shown in a hybrid laser diode including the silicon slap waveguide and a compound semiconductor ridge waveguide.

If we look at forms of a waveguide mode for three cases (i.e., cases a, b, and c), as the thickness of the silicon slap waveguide becomes thinner, distribution of the waveguide mode passes over the compound semiconductor ridge waveguide. At this point, the first higher mode does not exist when the thickness of the silicon slap waveguide is extremely thin (the case c). However, as the thickness of the silicon slap waveguide becomes thicker, an entire waveguide guides also the higher mode and the optical confinement coefficient of the higher mode in the compound semiconductor ridge waveguide exceeds that of the fundamental mode (the case b). At this region, the higher mode becomes a lasing mode, which should be surmounted for application in the wavelength division multiplexing system. And at this point, although the silicon slap waveguide guides the fundamental mode, the optical confinement coefficient of the fundamental mode in the silicon slap waveguide is below that of the higher mode (the case a).

This trend is identically shown when the silicon waveguide is a ridge waveguide. That is, in order to oscillate the fundamental mode, the thickness of the silicon waveguide needs to be thin. This means that distribution of the waveguide mode in the left and right direction is determined by the width of the compound semiconductor ridge waveguide. Additionally, in order to guide only the single mode, the width of the compound semiconductor ridge waveguide needs to be a small value of about 1 µm.

If the compound semiconductor ridge waveguide has the narrow width of about 1 µm, there is a significant disadvantage that leakage current occurs due to a surface recombination effect at the surface of the compound semiconductor ridge waveguide exposed to the external in a hybrid laser diode where a re-growth method cannot be applied.

A method of minimizing the surface recombination, which causes leakage current, broadens the width of the compound semiconductor ridge waveguide and implants impurities in a portion except for an area overlapping a fundamental mode in the compound semiconductor ridge waveguide in order to suppress oscillation of the higher mode. However, there is a limitation about accuracy that the boundary surface of the impurity region and a gain region may not be discretely defined in all vertical and parallel directions. Therefore, it is difficult to set up a gain area having the width of about 3 µm.

Figure 2A:
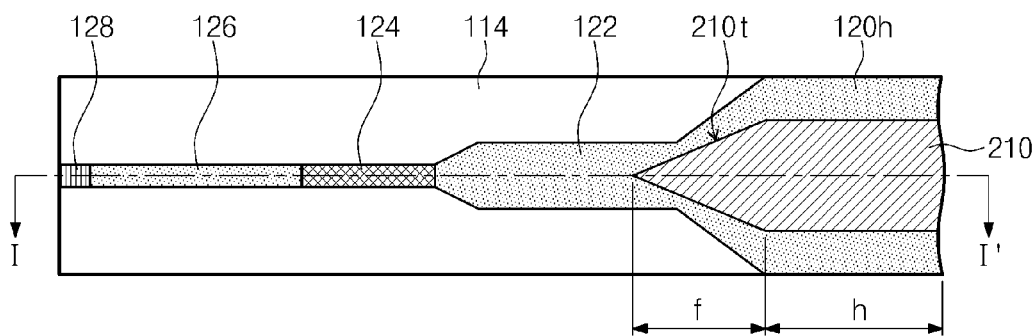
FIG. 2A is a plan view illustrating a resonator of a hybrid laser diode according to an embodiment of the present invention and FIG. 2B is a sectional view taken along a line I-I' of FIG. 2A.
Figure 2B:
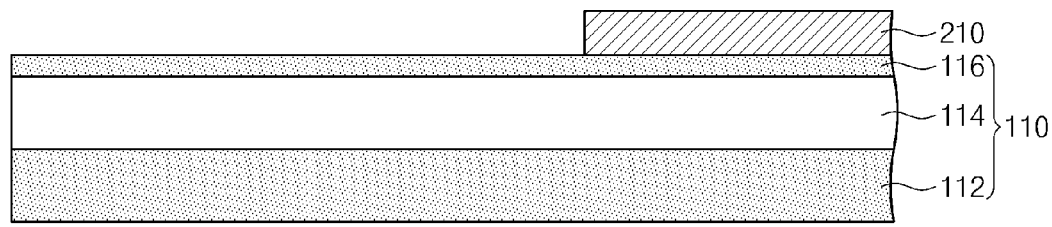

FIG. 2A is a plan view illustrating a resonator of a hybrid laser diode according to an embodiment of the present invention and FIG. 2B is a sectional view taken along a line I-I' of FIG. 2A.

Referring to FIGS. 2A and 2B, the resonator of the hybrid laser diode may include a substrate 110, a compound semiconductor waveguide 210, and a reflection part 128. The substrate 110 may include an underlying silicon layer 112, an insulation layer 114, and a silicon layer 116. The compound semiconductor waveguide 210 may be provided on the silicon layer 116 of the substrate 110. The reflection part 128 may be provided on one end of the silicon layer 116.

The resonator of the hybrid laser diode may be configured to provide an optical path (where light of a specific wavelength makes a round trip) to allow light having the same phase to be amplified. The optical path of the resonator of the hybrid laser diode according to an embodiment of the present invention may include the silicon layer 116 of the substrate 110, the compound semiconductor waveguide 210 on the silicon layer 116, and the reflection part 128 at one end of the silicon layer 116.

FIGS. 2A and 2B illustrate a portion of the resonator of the hybrid laser diode. This is for convenience of description but the resonator of an actual hybrid laser diode according to an embodiment of the present invention may have a full structure that further includes a mirror symmetric part at the right side of the drawings. This structure of the resonator of the hybrid laser diode may be apparent to those skilled in the art.

That is, the above resonator of the hybrid laser diode may include a substrate 110, a compound semiconductor waveguide 210, and reflection parts 128. The substrate 110 may include an underlying silicon layer 112, an insulation layer 114, and a silicon layer 116. The compound semiconductor waveguide 210 may be provided on the silicon layer 116 of the substrate 110. The reflection parts 128 may be provided on both ends of the silicon layer 116.

The substrate 110 may be a silicon on insulator (SOI) substrate. The silicon layer 116 may include a hybrid waveguide 120h, a multi-mode waveguide 122, and a single mode waveguide 126, which are connected in series. The multi-mode waveguide 122 may have a narrower width than the hybrid waveguide 120h and the single mode waveguide 126 may have a narrower width than the multi-mode waveguide 122.

The reason that the hybrid waveguide 120h, the multi-mode waveguide 122, and the single mode waveguide 126 are connected in series may be due to transition area waveguides provided therebetween, respectively. The transition area waveguide may have the width that is gradually narrower as it approaches from the hybrid waveguide 120h to the multi-mode waveguide 122, and from the multi-mode waveguide 122 to the single mode waveguide 126.

The compound semiconductor waveguide 210 may be provided on the hybrid waveguide 120h of the silicon layer 116 of the substrate 110. One end of the compound semiconductor waveguide 210 may have a coupling structure 210t of a tapered shape that overlaps a portion of the multi-mode waveguide 122 of the silicon layer 116. An area where the coupling structure 210t of a tapered shape is provided may be called an optical coupling area f.

The compound semiconductor waveguide 210 may be formed by bonding with the silicon layer 116 of the substrate 110. The forming of the compound semiconductor waveguide 210 may include patterning the silicon layer 116 of the substrate 110 using a photolithography in order to allow the silicon layer 116 to include the hybrid waveguide 120h, the multi-mode waveguide 122, and the single mode waveguide 126 (which are connected in series), bonding another substrate that includes the patterned compound semiconductor waveguide 210 on the substrate 110 in order for the hybrid waveguide 120h of the silicon layer 116 of the substrate 110 and the compound semiconductor waveguide 210 of another substrate to face each other, and removing another substrate except for the compound semiconductor waveguide 210.

The compound semiconductor waveguide 210 may include a Group III-V compound semiconductor. The compound semiconductor waveguide 210 may include InP, InGaAs, InGaAsP, AlGaInAs, and the like. Accordingly, the hybrid waveguide 120h and the compound semiconductor waveguide 210 may constitute a gain area h of the resonator of the hybrid laser diode. The compound semiconductor waveguide 210 may have the width of more than about 5 μm. The hybrid waveguide 120h may have the same width as the compound semiconductor waveguide 210 or have the broader width than the compound semiconductor waveguide 210. This is in order for obtaining a sufficient misalign margin during a process of bonding the compound semiconductor waveguide 210 with the hybrid waveguide 120h of the silicon layer 116 of the substrate 110.

The coupling structure 210t of a tapered shape at one end of the compound semiconductor waveguide 210 may overlap a portion of the multi-mode waveguide 122 of the silicon layer 116 at the optical coupling area f. Therefore, a waveguide mode including a higher mode may be easily transmitted to the multi-mode waveguide 122 of the silicon layer 116.

The reflection part 128 may be a distributed Bragg reflector (DBR), or a waveguide with diffraction gratings. The reflection part 128 may use a facet reflection. The reflection part 128 using the facet reflection may be manufactured with a mirror state at one end of the single mode waveguide 126 of the silicon layer 116. Accordingly, a fundamental mode transmitted by the single mode waveguide 126 may be feedback by the reflection part 128 to the gain area h of the resonator of the hybrid laser diode including the hybrid waveguide 120h and the compound semiconductor waveguide 210.

Operations of the resonator of the hybrid laser diode according to an embodiment of the present invention may be as follows. The waveguide mode including a higher mode generated in the gain area h of the resonator of the hybrid laser diode may be transmitted from the hybrid waveguide 120h and the compound semiconductor waveguide 210 to the multi-mode waveguide 122 of the silicon layer 116 through the tapered coupling structure 210t of the compound semiconductor waveguide 210 at the optical coupling area f. The waveguide mode including a higher mode may be transmitted into the single mode waveguide 126 through the multi-mode waveguide 122. The higher mode included in the waveguide mode transmitted to the single mode waveguide 126 may be removed due to the intensive loss while passing through the single mode waveguide 126, and thus only the fundamental mode included in the waveguide may be transmitted into the reflection part 128 at one end of the single mode waveguide 126. Additionally, the waveguide including only the fundamental mode reflected by the reflection part 128 may be feedback to the gain area h of the resonator of the hybrid laser diode.

Moreover, the waveguide mode including only the fundamental mode, which is feedback to the gain area h of the resonator of the hybrid laser diode, may be transmitted and feedback through a multi-mode waveguide (not shown), a single mode waveguide (not shown), and a reflection part (not shown), which are included in a mirror symmetric portion with respect to the right of the drawings. Moreover, a modal gain may be relatively increased. Accordingly, the resonator of the hybrid laser diode according to an embodiment of the present invention may oscillate only the fundamental mode where the modal gain is relatively increased.

The higher mode in the waveguide mode may be removed due to a large loss when passing through the single mode waveguide 126, but this is possible only when the single mode waveguide 126 has a sufficient length. That is, the length of the single mode waveguide 126 needs to be reduced in order to form a resonator of a hybrid laser diode having a smaller size.

Accordingly, the resonator of the hybrid laser diode according to an embodiment of the present invention may further include a mode selecting unit 124 provided between the multi-mode waveguide 122 and the single mode waveguide 126. The mode selecting unit 124 may be a multi-mode interference (MMI) waveguide. The MMI waveguide may have various focuses at respectively different positions according to each mode refractive index of the fundamental mode and the higher mode included in the waveguide mode. That is, the single mode waveguide is disposed at a position of the MMI waveguide on which the fundamental mode in the waveguide mode is focused, such that only the fundamental mode in the waveguide mode may be transmitted into the single mode waveguide 126.

Since the mode selecting unit 124 having this mode selection function is interposed between the multi-mode waveguide 122 and the single mode waveguide 126, the resonator of the hybrid laser diode can relatively increase a modal gain of the fundamental mode even if the gain area h of the resonator of the hybrid layer diode including the hybrid waveguide 120*h* and the compound semiconductor waveguide 210 does not generate a waveguide mode only including the fundamental mode. Accordingly, the resonator of the hybrid laser diode according to an embodiment of the present invention may smoothly oscillate the fundamental mode.

As a result, since the resonator of the hybrid laser diode according to an embodiment of the present invention can include the compound semiconductor waveguide 210 having the broad width, effect due to the surface recombination can be reduced. Accordingly, a threshold current of the hybrid laser diode can be reduced.

Additionally, since the resonator of the hybrid laser diode according to an embodiment of the present invention is an optical coupling between the multi-mode waveguide 122 having a sufficient width and the compound semiconductor waveguide 210, a process for forming a tapered coupling structure 210*t* of the compound semiconductor waveguide 210 does not require submicron accuracy. Accordingly, a process for manufacturing a hybrid laser diode may become simple.

The resonator of the hybrid laser diode according to an embodiment of the present invention has the silicon layer including the hybrid waveguide, the multi-mode waveguide, and the single mode waveguide to remove the higher mode that transmitted and amplifies only the fundamental mode. Thus, only the fundamental mode can be oscillated. Accordingly, even if the compound semiconductor waveguide has a broad width, a hybrid laser diode with the fundamental mode can be provided.

Additionally, the resonator of the hybrid laser diode according to an embodiment of the present invention has the compound semiconductor waveguide having the broad width. Thus, effect due to the surface recombination is minimized such that a threshold current can be lowered. Accordingly, a reliability-enhanced hybrid laser diode can be provided.

Furthermore, the resonator of the hybrid laser diode according to an embodiment of the present invention includes the multi-mode silicon waveguide and a broad compound semiconductor waveguide in the coupling region, this design reduces a requested accuracy in processing for optical coupling between the silicon layer and the compound semiconductor waveguide. Accordingly, a hybrid laser diode that can be manufactured using a simple process with a low accuracy can be provided.

Figure 3A:
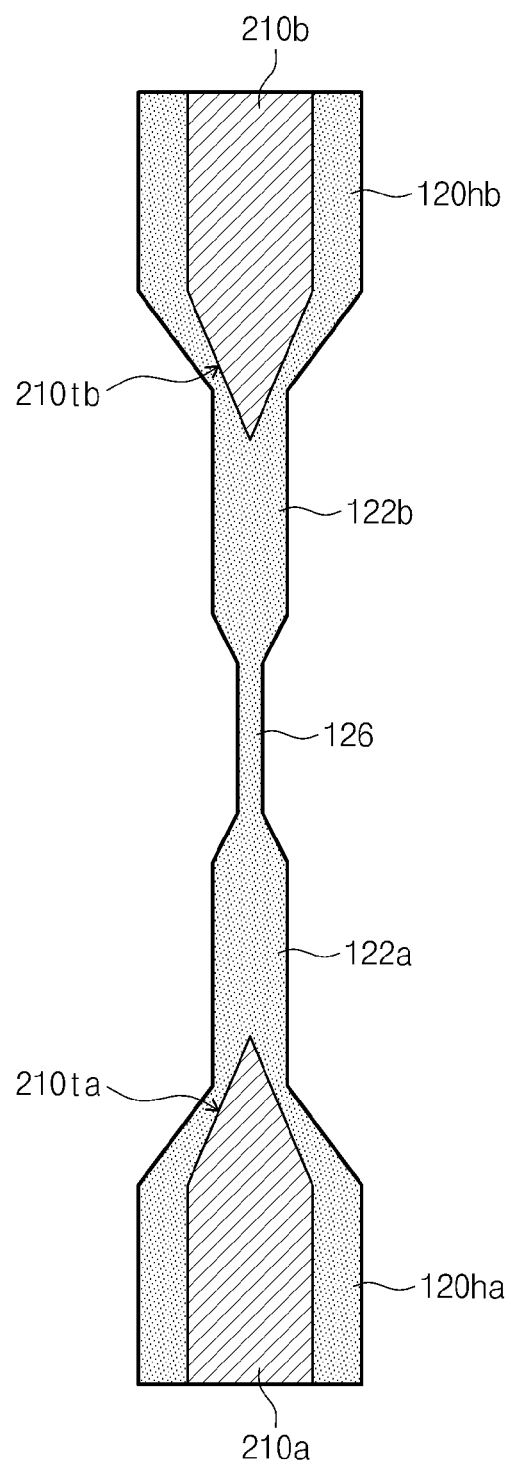
FIG. 3A is a plan view of a device structure modified for recognizing a fundamental mode oscillation characteristic of a resonator of a hybrid laser diode according to an embodiment of the present invention.
Figure 3B:
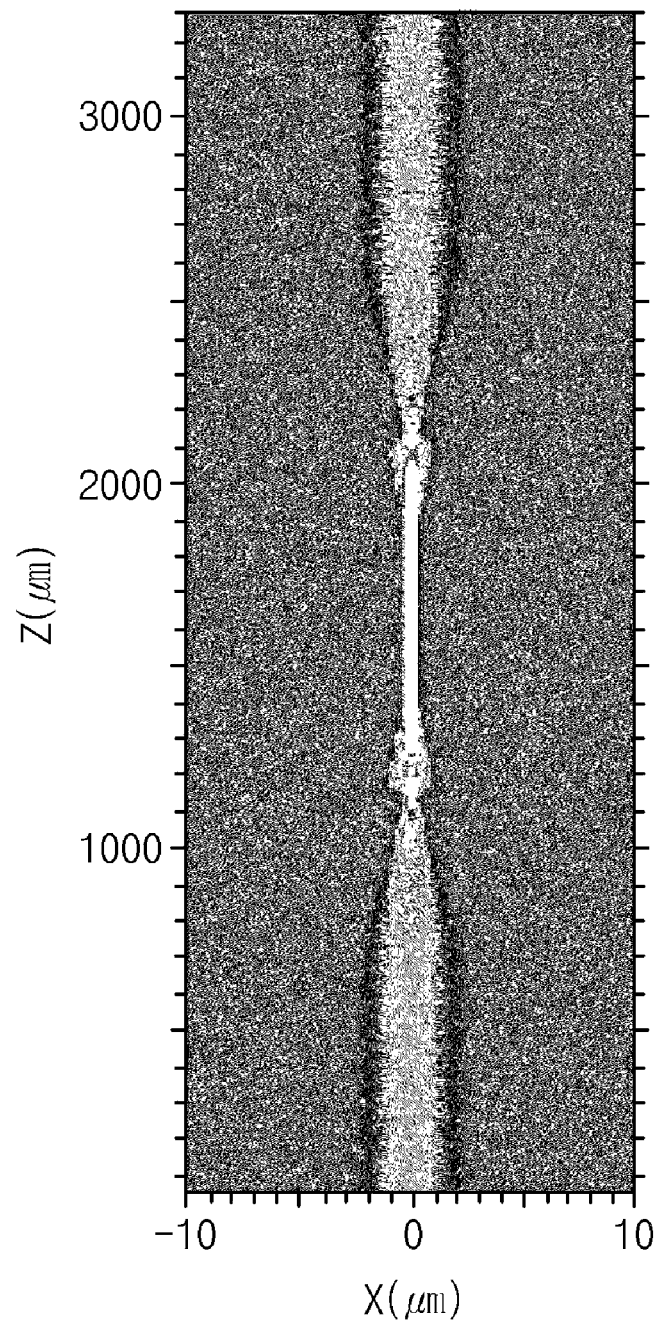
FIGS. 3B and 3C are views illustrating respective wave characteristics of a fundamental mode and a higher mode of the device of FIG. 3A.
Figure 3C:
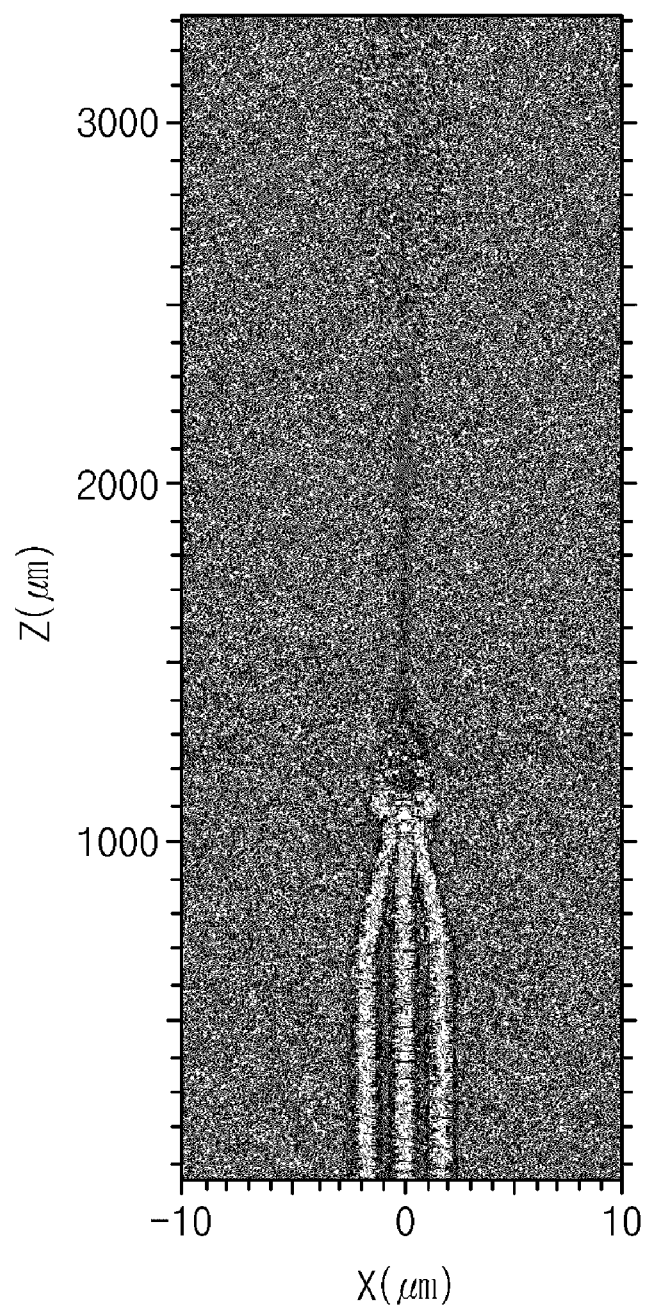

FIG. 3A is a plan view of a device structure modified for recognizing a fundamental mode oscillation characteristic of a resonator of a hybrid laser diode according to an embodiment of the present invention. FIGS. 3B and 3C are views illustrating respective wave characteristics of a fundamental mode and a higher mode of the device of FIG. 3A.

Referring to FIG. 3A, a device for recognizing a fundamental mode oscillation characteristic of the resonator of the hybrid laser diode includes two devices. The two devices have a resonator structure of the hybrid laser diode of FIG. 2A and are connected by the single mode waveguide 126 in a mirror-symmetric form, and thus share the single mode waveguide 126. This two devices may include a first device and a second device, and the first and second devices may have a structure except for the reflection part 128 of FIG. 2A in the resonator structure of the hybrid laser diode of FIG. 2A. Additionally, the first and second devices may have a structure where the mode selecting unit 124 of FIG. 2A is omitted from the resonator of the hybrid laser diode of FIG. 2A.

The first device may include a first gain area, a first multi-mode waveguide 122*a*, and a single mode waveguide 126. The first gain area may include a first hybrid waveguide 120*ha* and a first compound semiconductor waveguide 210*a*. The first multi-mode waveguide 122*a* may be connected in series to the first hybrid waveguide 120*ha* by a transition area waveguide. The single mode waveguide 126 may be connected in series to the first multi-mode waveguide 122*a* by a transition area waveguide. A tapered coupling structure 210*ta* of the first compound semiconductor waveguide 210*a* may partially overlap the first multi-mode waveguide 122*a*.

The second device may include a second gain area, a second multi-mode waveguide 122*b*, and a single mode waveguide 126. The second gain area may include a second hybrid waveguide 120*hb* and a second compound semiconductor waveguide 210*b*. The second multi-mode waveguide 122*b* may be connected in series to the second hybrid waveguide 120*hb* by a transition area waveguide. The single mode waveguide 126 may be connected in series to the second multi-mode waveguide 122*b* by a transition area waveguide. A tapered coupling structure 210*tb* of the second compound semiconductor waveguide 210*b* may partially overlap the second multi-mode waveguide 122*b*.

Referring to FIGS. 3B and 3C, under the assumption that a waveguide mode is generated in the first gain area, when the waveguide mode is applied to the first gain area, results measuring each wave characteristic of a fundamental mode and a higher mode in a device for recognizing a fundamental mode oscillation characteristic of the resonator of the hybrid laser diode are shown. If the waveguide mode is applied to the second gain area, the up and down of FIGS. 3B and 3C will be reversed.

As illustrated in FIG. 3B, if the fundamental mode is applied to the first gain area, the fundamental mode may be transmitted into the first multi-mode waveguide 122*a* through the tapered coupling structure 210*ta* of the first compound semiconductor waveguide 210*a*. Then, the fundamental mode may be transmitted into the single mode waveguide 126 through the first multi-mode waveguide 122*a*. Additionally, the fundamental mode transmitted into the single mode waveguide 126 may be transmitted into the second gain area through the tapered coupling structure 210*tb* of the second compound semiconductor waveguide 210*b*.

Unlike this, as illustrated in FIG. 3C, if the higher mode is applied to the first gain area, the higher mode may be transmitted into the first multi-mode waveguide 122*a* through the tapered coupling structure 210*ta* of the first compound semiconductor waveguide 210*a*, and the higher mode may be transmitted into the single mode waveguide 126 through the first multi-mode waveguide 122*a*. However, the higher mode may be removed due to a great loss while passing through the single mode waveguide 126. Therefore, the higher mode cannot be transmitted into the tapered coupling structure 210*tb* of the second multi-mode waveguide 122*b* and the second compound semiconductor waveguide 210*b*, and thus does not reach the second gain area.

Consequently, according to the resonator of the hybrid laser diode according to an embodiment of the present invention, even when a waveguide mode including a fundamental mode and a higher mode is generated at the gain area including the hybrid waveguide 120*h* of FIG. 2A and the compound semiconductor waveguide 210 of FIG. 2A, only the fundamental mode can be transmitted by the multi-mode waveguide 122 of FIG. 2A, the single mode waveguide 126 of FIG. 2A, and the reflection part 128. Accordingly, the resonator of the hybrid laser diode according to an embodiment of the present invention may smoothly oscillate the fundamental mode of an increased modal gain.

As mentioned above, according to the object resolving means of the present invention, a semiconductor layer of a resonator may include a hybrid waveguide, a multi-mode waveguide, and a single mode waveguide. Since a higher mode is removed and only a fundamental mode is transmitted and amplified, the only the fundamental mode can be oscillated. Accordingly, even when a compound semiconductor waveguide has a broad width, a hybrid laser diode performing a fundamental mode oscillation can be provided.

Moreover, since a compound semiconductor waveguide has a broad width according to the object resolving means of the present invention, effect due to the surface recombination may be minimized such that a threshold current is lowered and leakage current is minimized. As a result, a reliability-improved hybrid laser diode can be provided.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A resonator of a hybrid laser diode comprising:
   a substrate including a semiconductor layer where a hybrid waveguide, a multi-mode waveguide, and a single mode waveguide are connected in series;
   a compound semiconductor waveguide, provided on the hybrid waveguide of the semiconductor layer, having a tapered coupling structure at one end of the compound semiconductor waveguide, the tapered coupling structure overlapping the multi-mode waveguide partially; and
   a reflection part provided on one end of the single mode waveguide,
   wherein the multi-mode waveguide has a narrower width than the hybrid waveguide and the single mode waveguide has a narrower width than the multi-mode waveguide.

2. The resonator of claim 1, wherein the compound semiconductor waveguide has a width of more than about 5 µm.

3. The resonator of claim 1, wherein the compound semiconductor waveguide comprises a Group III-V compound semiconductor.

4. The resonator of claim 1, wherein the substrate is a silicon on insulator (SOI) substrate including an underlying semiconductor layer, an insulation layer on the underlying semiconductor layer, and the semiconductor layer on the insulation layer.

5. The resonator of claim 4, wherein the compound semiconductor waveguide is formed by bonding with the semiconductor layer of the substrate.

6. The resonator of claim 1, further comprising a mode selecting unit provided between the multi-mode waveguide and the single mode waveguide.

7. The resonator of claim 6, wherein the mode selecting unit is a multi-mode interference waveguide.

8. The resonator of claim 1, wherein the reflection part uses a distributed Bragg reflector or a facet reflection, the disturbed Bragg reflector being a waveguide with diffraction gratings.

9. The resonator of claim 1, wherein the hybrid waveguide, the multi-mode waveguide, and the single mode waveguide are connected in series through respective transition area waveguides therebetween.

10. The resonator of claim 9, wherein the transition area waveguide has a width that becomes narrower when it approaches from the hybrid waveguide to the multi-mode waveguide and from the multi-mode waveguide to the single mode waveguide.

* * * * *